(12) United States Patent
Hsieh et al.

(10) Patent No.: US 7,499,519 B1
(45) Date of Patent: Mar. 3, 2009

(54) BIDIRECTIONAL SHIFT REGISTER

(75) Inventors: Chen-Hui Hsieh, Chu-Pei (TW);
Chingwen Chang, Saratoga, CA (US);
Wei-Chia Cheng, Hsinchu (TW);
Shih-Chieh Lin, Hualien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/954,640

(22) Filed: Dec. 12, 2007

(51) Int. Cl.
*G11C 19/00* (2006.01)
(52) U.S. Cl. .......................... 377/64; 377/67
(58) Field of Classification Search ............... None
See application file for complete search history.

(56) References Cited

U.S. PATENT DOCUMENTS

| | | | | |
|---|---|---|---|---|
| 4,876,704 A | * | 10/1989 | Ozaki | 377/70 |
| 5,198,999 A | * | 3/1993 | Abe et al. | 365/189.05 |
| 5,339,079 A | * | 8/1994 | Ledzius et al. | 341/144 |
| 6,333,959 B1 | * | 12/2001 | Lai et al. | 377/69 |
| 6,459,751 B1 | * | 10/2002 | Chen et al. | 377/26 |
| 6,678,315 B1 | * | 1/2004 | Hikita et al. | 375/222 |
| 6,778,626 B2 | * | 8/2004 | Yu | 377/69 |
| 7,181,662 B2 | * | 2/2007 | Chien | 714/724 |
| 7,313,212 B2 | * | 12/2007 | Lim | 377/64 |

* cited by examiner

*Primary Examiner*—Cassandra Cox
(74) *Attorney, Agent, or Firm*—K & L Gates LLP

(57) ABSTRACT

A bidirectional shift register is disclosed which comprises a first and second flip-flop, a first multiplexer having an output coupled to an input of the first flip-flop, and a second multiplexer having an output coupled to an input of the second flip-flop wherein an output of the first flip-flop is coupled to an input of the second multiplexer, an output of the second flip-flop is coupled to an input of the first multiplexer.

10 Claims, 6 Drawing Sheets

BIDIRECTIONAL SHIFT REGISTER

BACKGROUND

The present invention relates generally to integrated circuit design, and more particularly, to a bidirectional shift register design.

In digital circuit, a shift register is a group of flip-flops set up in a linear fashion where an output of a flip-flop is connected to an input of a next flip-flop. Therefore data are shifted down the line when the shift register is activated. Shift register is wildly used in integrated circuits. One application is for programming or reading out electrical fuses, where data intended to be programmed into the electrical fuses are serially clocked in a shift register. Data stored in the electrical fuses are first read to the shift register and then serially clocked out.

FIG. 1 shows a conventional unidirectional first-in-first-out (FIFO) shift register 100, which comprises, for illustration purpose, four flip-flops K[0:3]. Node D and Q designate input and output terminals, respectively, of the flip-flop K[i], where $0 \leq i \leq 3$. As shown in FIG. 1, an output of the flip-flop K[i] is connected to an input of a next flip-flop K[i+1]. A clock signal CLK is coupled to every flip-flop K[0:3]. Upon an activation of the clock signal CLK, data will be shifted one bit to the right, i.e., DIN to K[0], K[0] to K[1], K[1] to K[2] and K[2] to K[3]. Data at K[3] is shifted out to DOUT upon an activation of the clock signal CLK. Apparently data being first shifted in will be shifted out first.

Alternatively, a series of flip-flops can be organized in a last-in-first-out (LIFO) fashion. In certain applications, both FIFO and LIFO, i.e. bidirectional, may be required of a shift register. In such applications, a conventional circuit is to include both FIFO and LIFO functional circuits with a control signal switching the shift register between the two functions. However, since the conventional bidirectional shift register requires two sets of flip-flops to perform such bidirectional shifting functions, a transistor count of such conventional bidirectional shift register will be at least doubled. When the number of bits of the bidirectional shift register becomes large, the additional transistors will occupy a significant amount of chip area, which results in a cost increase. As such, what is desired is a bidirectional shift register requiring only a small amount of additional circuits over unidirectional shift registers.

SUMMARY

In view of the foregoing, the present invention provides a bidirectional shift register, which comprises a first and second flip-flop, a first multiplexer having an output coupled to an input of the first flip-flop, and a second multiplexer having an output coupled to an input of the second flip-flop, wherein an output of the first flip-flop is coupled to an input of the second multiplexer, and an output of the second flip-flop is coupled to an input of the first multiplexer. A control signal determines the multiplexer's input selection. In one selection, data stored in the first and second flip-flops swap upon an activation of a clock signal, so that data can be last-in-first-out.

The construction and method of operation of the invention, however, together with additional objects and advantages thereof will be best understood from the following description of specific embodiments when read in connection with the accompanying drawings.

BRIEF DESCRIPTION OF THE DRAWINGS

The present invention is illustrated by way of example, and not by way of limitation, in the figures of the accompanying drawings in which like reference numerals refer to similar elements.

DESCRIPTION

Figure 1:
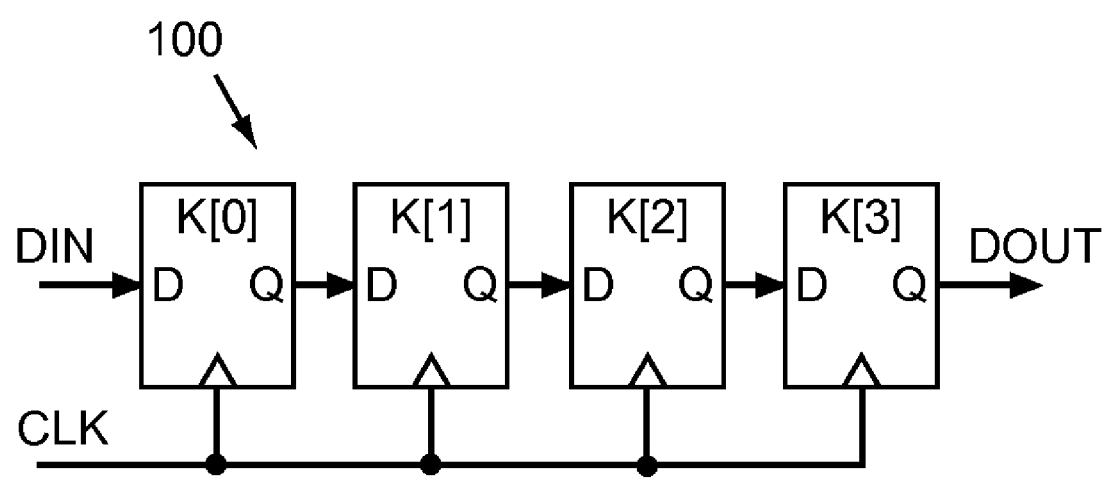
FIG. 1 shows a conventional unidirectional first-in-first-out (FIFO) shift register.

The following will provide a detailed description of a bidirectional shift register that can perform either first-in-first-out (FIFO) or last-in-first-out (LIFO) operations without significantly increasing the transistor count therein.

FIGS. 2A through 2D illustrate a bidirectional shift register 200 with even number of flip-flops according to a first embodiment of the present invention. For illustration purpose, the bidirectional shift register 200 has four bits, and comprises four flip-flops K[0:3] and three multiplexers M[0:2]. The flip-flops K[0:3] forms a serial string. The flip-flop K[i], where $0 \leq i \leq 3$, shifts data at an input D to an output Q thereof when a clock signal CLK is activated. Typically, the clock signal CLK is activated on the signal's rising edge. The multiplexer M[j], where $0 \leq j \leq 2$, has two inputs 1 and 2, and one output 3. As an example, when a control signal SEL is turned to the logic "1", the multiplexer M[j] connects the input 1 to the output 3 as shown by the dotted lines in FIG. 2A. Conversely, when the control signal SEL is turned to the logic "0", the multiplexer M[j] connects the input 2 to the output 3 as shown by the dotted lines in FIG. 2C.

Figure 2A:
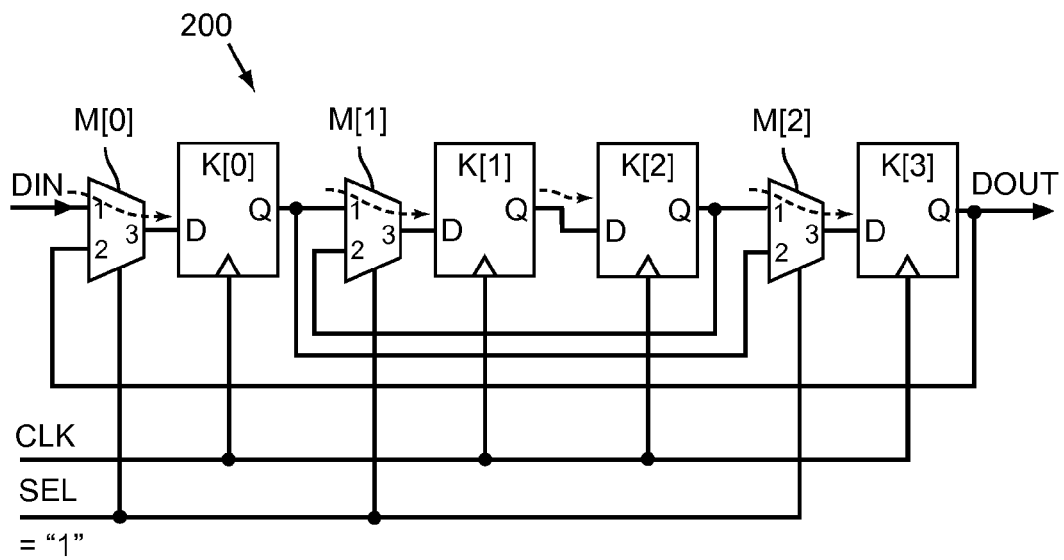
FIGS. 2A and 2B illustrates a bidirectional shift register with an even number of flip-flops in FIFO mode according to a first embodiment of the present invention.
Figure 2B:
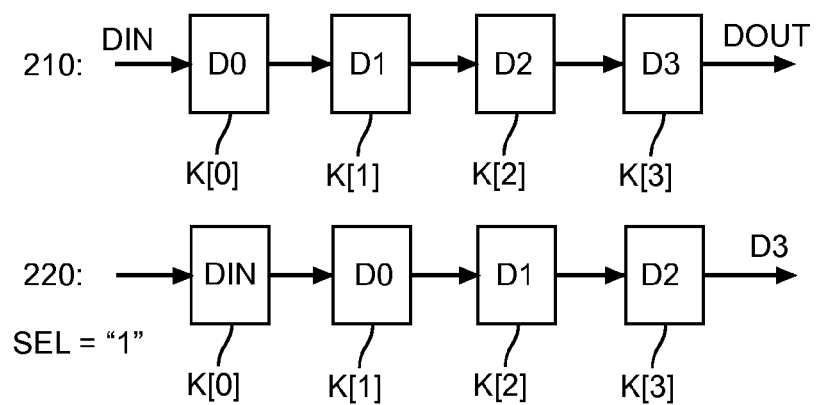
Figure 2C:
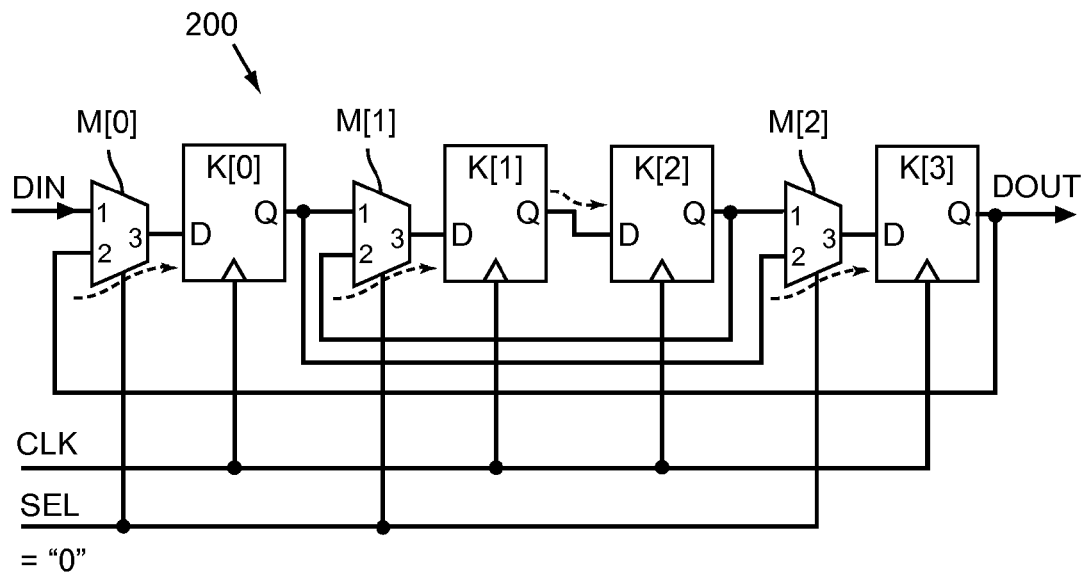
FIGS. 2C and 2D illustrates the bidirectional shift register of FIG. 2A in LIFO mode according to the first embodiment of the present invention.

Referring to FIGS. 2A and 2C, an output of the flip-flop K[3] is coupled to the input 2 of the multiplexer M[0]. An output of the flip-flop K[2] is coupled to the input 2 of the multiplexer M[1]. An output of the flip-flop K[0] is coupled to the input 2 of the multiplexer M[2]. There is no multiplexer inserted between the two flip-flops in the middle of the flip-flop string, i.e., an output of the flip-flop K[1] is coupled directly to an input of the flip-flop K[2].

Referring to FIG. 2A, the control signal SEL is at the logic "1", the multiplexer M[j] connects the input 1 to the output 3. Upon an activation of the clock signal CLK, data at DIN will be shifted to K[0], data at K[i] will be shifted to K[i+1], where $0 \leq i \leq 2$, and data at K[3] will be shifted out to DOUT. As shown in FIG. 2B, the flip-flops K[0:3] initially stores D0, D1, D2 and D3, respectively, in step 210. After an activation of the clock signal CLK, D3 will be shifted out, the flip-flops K[0:3] stores DIN, D0, D1 and D2, respectively, in step 220. In this case the shift register 200 functions as a FIFO shift register.

Figure 2D:
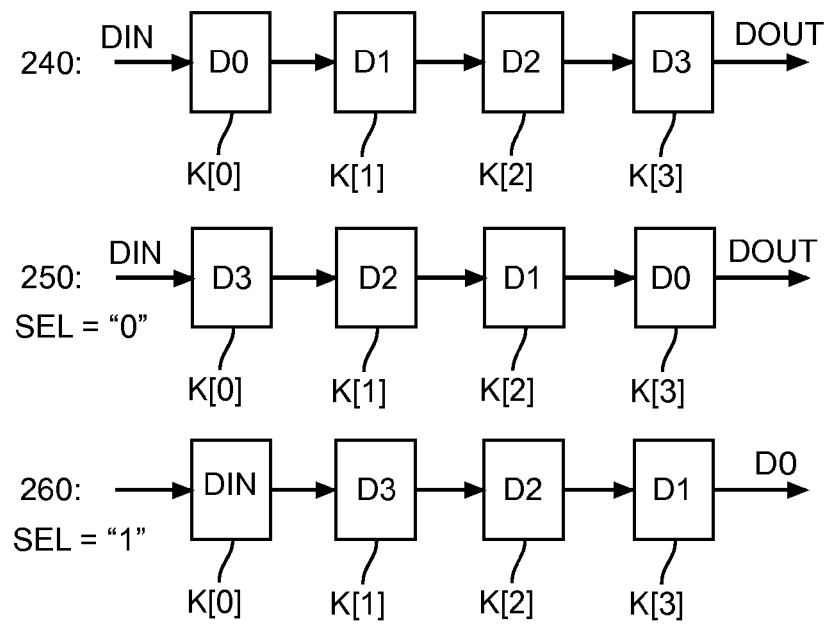

Referring to FIG. 2C, the control signal SEL is at the logic "0", the multiplexer M[j] connects the input 2 to the output 3. Upon an activation of the clock signal CLK, data in the flip-flops K[3] and K[0] will swap. Data in the flip-flops K[2] and K[1] will also swap. As shown in FIG. 2D, the flip-flops K[0:3] initially stores D0, D1, D2 and D3, respectively, in step 240. After a first activation of the clock signal CLK, the flip-flops K[0:3] stores D3, D2, D1 and D0, respectively, in step 250. In step 260, the control signal SEL is switched back to "1", and after a second activation of the clock signal CLK, data are sequentially shifted to the right with D0 comes out first. Therefore, in this case the shift register 200 functions as LIFO shift register.

FIGS. 3A through 3D illustrate a bidirectional shift register 300 with an odd number of flip-flops according to a second embodiment of the present invention. For illustration purpose, the bidirectional shift register 300 has five bits, and comprises five flip-flops K[0:4] and five multiplexers M[0:4]. Both the flip-flops K[0:4] and the multiplexers M[0:4] function exactly the same as those shown in FIGS. 2A and 2C. Also as an example, when a control signal SEL is turned to the logic "1", the multiplexer M[j] connects the input 1 to the output 3 as shown by the dotted lines in FIG. 3A. Conversely, when the control signal SEL is turned to the logic "0", the multiplexer M[j] connects the input 2 to the output 3 as shown by the dotted lines in FIG. 3C.

Figure 3A:
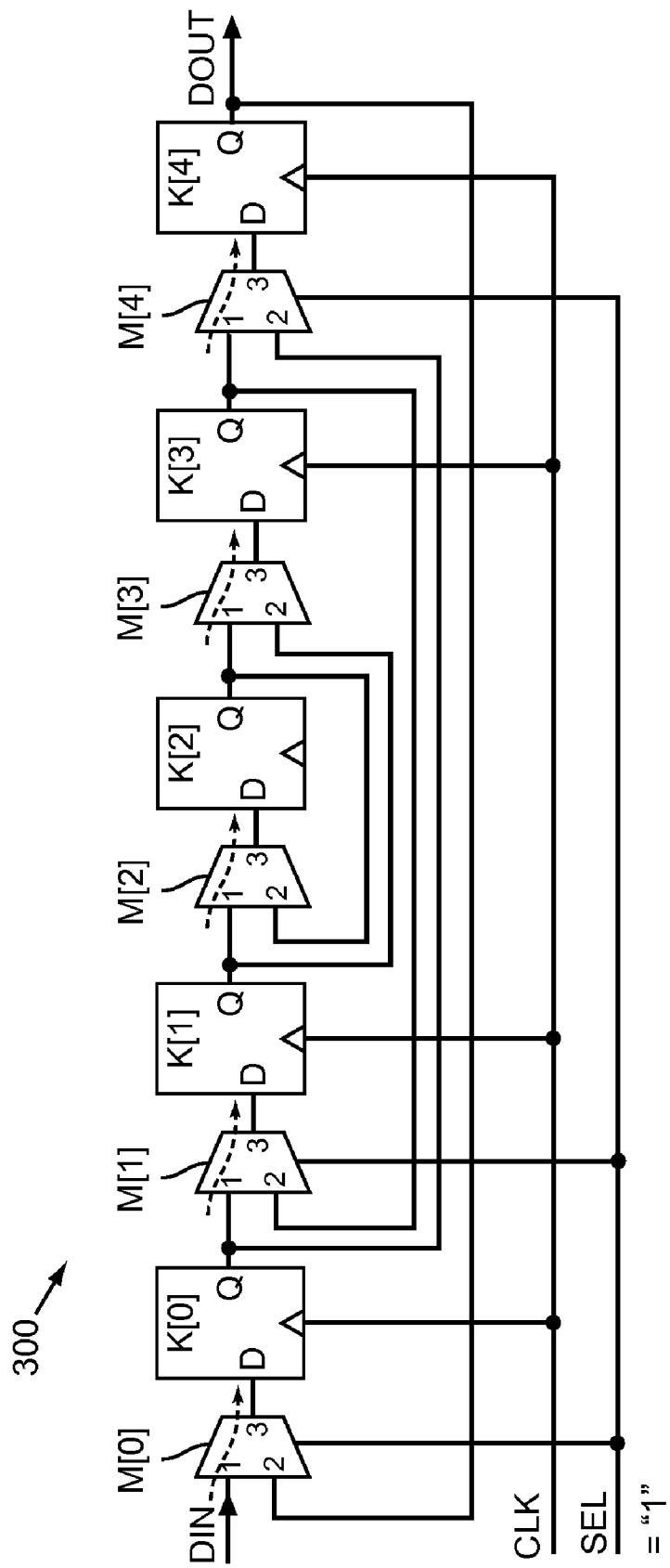
FIGS. 3A and 3B illustrates a bidirectional shift register with an odd number of flip-flops in FIFO mode according to a second embodiment of the present invention.
Figure 3C:
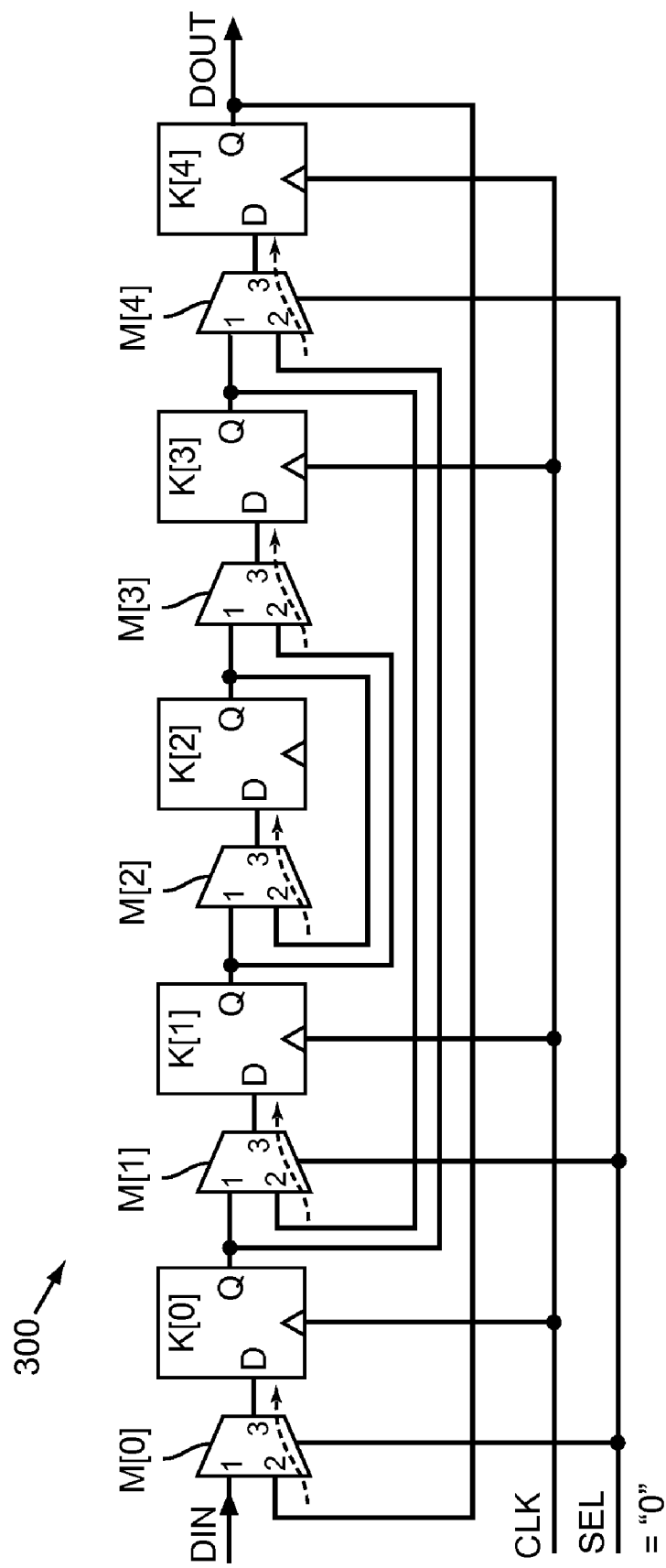
FIGS. 3C and 3D illustrates the bidirectional shift register of FIG. 3A in LIFO mode according to the second embodiment of the present invention.

Referring to FIGS. 3A and 3C, an output of the flip-flop K[4] is coupled to the input 2 of the multiplexer M[0]. An output of the flip-flop K[3] is coupled to the input 2 of the multiplexer M[1]. An output of the flip-flop K[0] is coupled to the input 2 of the multiplexer M[4]. An output of the flip-flop K[1] is coupled to the input 2 of the multiplexer M[3]. An output of the flip-flop K[2], which is in the middle of the string, is coupled to the input 2 of the multiplexer M[2]. Therefore, when the control signal SEL is at the logic "0", data in the middle flip-flop K[2] is fed back to itself after an activation of the clock signal CLK.

Figure 3B:
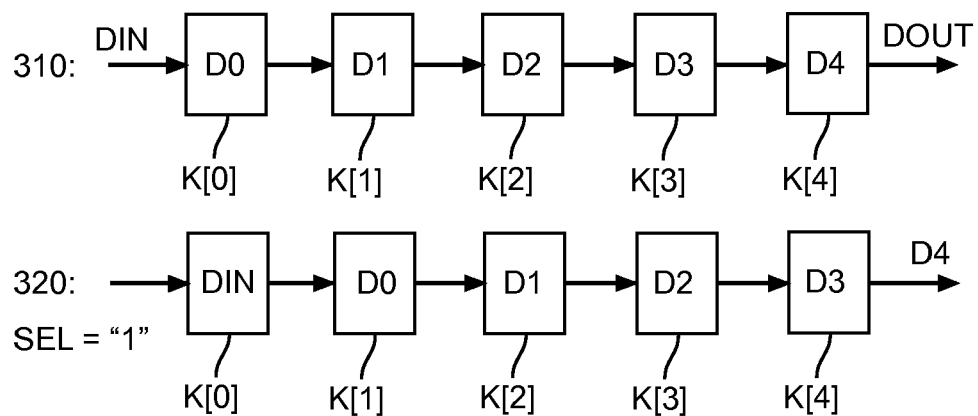

Referring to FIG. 3A, the control signal SEL is at the logic "1", the multiplexer M[j] connects the input 1 to the output 3. Upon an activation of the clock signal CLK, data at DIN will be shifted to K[0], data at K[i] will be shifted to K[i+1], where 0≦i≦3, and data at K[4] will be shifted out to DOUT. As shown in FIG. 3B, the flip-flops K[0:4] initially stores D0, D1, D2, D3 and D4, respectively, in step 310. After an activation of the clock signal CLK, D4 will be shifted out, the flip-flops K[0:4] stores DIN, D0, D1, D2 and D3, respectively, in step 320. In this case the shift register 300 functions as a FIFO shift register.

Figure 3D:
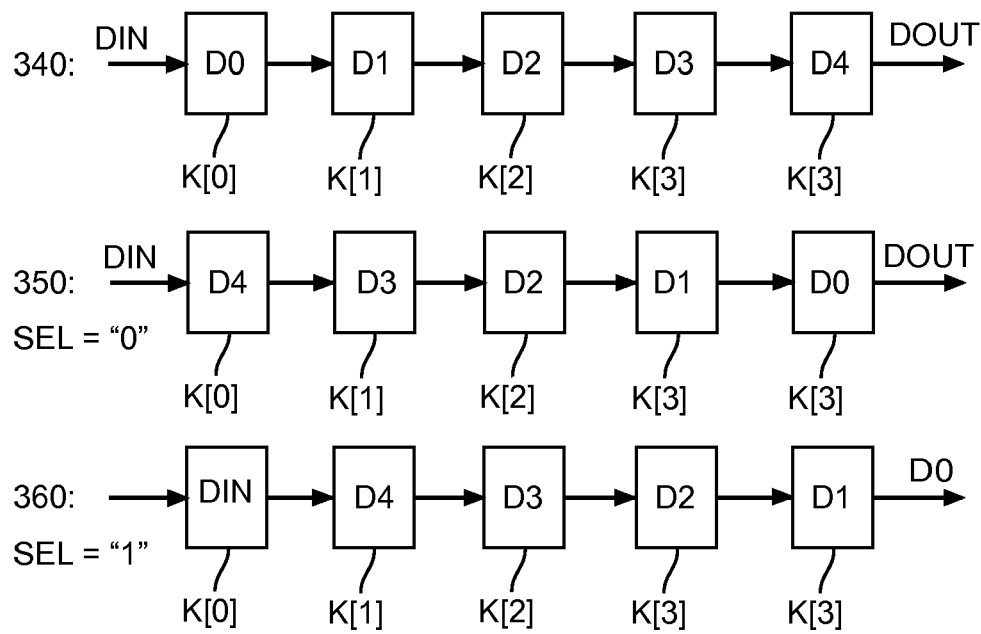

Referring to FIG. 3C, the control signal SEL is at the logic "0", the multiplexer M[j] connects the input 2 to the output 3. Upon an activation of the clock signal CLK, data in the flip-flops K[4] and flip-flop K[0] will swap. Data in the flip-flop K[3] and K[1] will also swap. Data in the flip-flop K[2] remains. As shown in FIG. 3D, the flip-flops K[0:4] initially stores D0, D1, D2, D3 and D4, respectively, in step 340. After a first activation of the clock signal CLK, the flip-flops K[0:4] stores D4, D3, D2, D1 and D0, respectively, in step 350. In step 360, the control signal SEL is switched back to "1", and after a second activation of the clock signal CLK, data is sequentially shifted to the right with D0 comeing out first. Therefore in this case the shift register 300 functions as LIFO shift register.

In summary, the present invention achieves bidirectional shifting by simply adding multiplexers and an additional clock cycle to a conventional shift register. During the additional clock cycle, first entered data is swapped with later entered data, therefore, during a subsequent normal shifting operation, first entered data will be shifted out last. Although only four and five bits of shift registers are used to illustrate the essence of the present invention, a skilled artisan has no difficulty to expand the idea to other shift registers with more bits. In fact, adding the additional data swapping clock cycle can be applied to not just LIFO operation mode, it can be used to organize the data pattern in any desired sequence which depends on how the data is swapped. Besides, even though the flip-flop are used in forming the shift registers, a skilled artisan would appreciate other kinds of data storage devices that can latch data upon an activation of a clock signal that may also be used in place of the flip-flop.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A shift register comprising:
   a first data storage unit and a second data storage unit;
   a first multiplexer having an output coupled to an input of the first data storage unit;
   a second multiplexer having a first input coupled to an output of the first data storage unit and an output coupled to an input of the second data storage unit;
   a third data storage unit having an output coupled to a second input of the second muliplexer, wherein an output of the second data storage unit and an input of the third data storage unit are coupled to each other with no multiplexer disposed therebetween;
   a fourth data storage unit having an output coupled to an input of the first multiplexer; and
   a third multiplexer having an output coupled to an input of the fourth data storage unit, a first input being coupled to the output of the third data storage unit, and a second input being coupled to the output of the first data storage unit.

2. The shift register of claim 1 wherein the first and second data storage units are flip-flops.

3. The shift register of claim 1 wherein the first and second data storage units are configured to latch data presented at the respective inputs upon an activation of a signal supplied thereto.

4. The shift register of claim 1 wherein the first and second multiplexers are commonly controlled by a select signal.

5. A shift register comprising:
   a first flip-flop and a second flip-flop;
   a first multiplexer having an output coupled to an input of the first flip-flop;
   a second multiplexer having a first input coupled to an output of the first flip-flop and an output coupled to an input of the second flip-flop;
   a third flip-flop having an output coupled to a second input of the second multiplexer, wherein an output of the second flip-flop and an input of the third flip-flop are coupled to each other with no multiplexer disposed therebetween;

a fourth flip-flop having an output coupled to an input of the first multiplexer; and a third multiplexer having an output coupled to an input of the fourth flip-flop, a first input being coupled to the output of the third flip-flop, and a second input being coupled to the output of the first flip-flop.

6. The shift register of claim 5 wherein the first and second flip-flops are configured to latch data presented at the respective inputs upon an activation of a signal supplied thereto.

7. The shift register of claim 5 wherein the first and second multiplexers are commonly controlled by a select signal.

8. A shift register comprising:

a plurality of flip-flops;

a plurality of multiplexers with outputs coupled to corresponding inputs of the plurality of flip-flops, respectively;

a first flip-flop of the plurality of flip-flops having an input coupled to an output of a first multiplexer of the plurality of multiplexers;

a second flip-flop of the plurality of flip-flops having an input coupled to an put of a second multiplexer of the plurality of multiplexers, wherein a first input of the second multiplexer is coupled to an output of the first flip-flop;

a third flip-flop of the plurality of flip-flops having an input coupled to an output of a third multiplexer of the plurality of multiplexers, wherein the third multiplexer having a first input coupled to an output of the second flip-flop and a second input coupled to an output of the third flip-flop;

a fourth flip-flop of the plurality of flip-flops having an input coupled to an output of a fourth multiplexer of the plurality of multiplexers, wherein an output of the fourth flip-flop is coupled to a second input of the second multiplexer and an input of the fourth multiplexer is coupled to the first input of the third multiplexer;

a fifth flip-flop of the plurality of flip-flops having an input coupled to an output of a fifth multiplexer of the plurality of multiplexers, wherein an output of the fifth flip-flop is coupled to an input of the first multiplexer and an input of the fifth multiplexer is coupled to the output of the first flip-flop.

9. The shift register of claim 8 wherein the plurality of flip-flops is configured to latch data presented at the respective inputs upon an activation of a signal supplied thereto.

10. The shift register of claim 8 wherein the plurality of multiplexers is commonly controlled by a select signal.

* * * * *